United States Patent
Werber et al.

(10) Patent No.: US 9,025,128 B2
(45) Date of Patent: May 5, 2015

(54) ACTUATOR INCLUDING MAGNET FOR A PROJECTION EXPOSURE SYSTEM AND PROJECTION EXPOSURE SYSTEM INCLUDING A MAGNET

(75) Inventors: Armin Werber, Gottenheim (DE); Norbert Muehlberger, Aalen-Ebnat (DE); Almut Czap, Aalen (DE); Juergen Fischer, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 865 days.

(21) Appl. No.: 13/196,592

(22) Filed: Aug. 2, 2011

(65) Prior Publication Data
US 2012/0008121 A1    Jan. 12, 2012

Related U.S. Application Data

(63) Continuation of application No. PCT/EP2010/051238, filed on Feb. 2, 2010.

(30) Foreign Application Priority Data

Feb. 10, 2009   (DE) .......................... 10 2009 008 209

(51) Int. Cl.
*G03F 7/20* (2006.01)
*G02B 26/08* (2006.01)
*G02B 27/00* (2006.01)
(Continued)

(52) U.S. Cl.
CPC .......... *G03F 7/70291* (2013.01); *G02B 26/085* (2013.01); *G02B 27/0006* (2013.01); *G03F 7/7095* (2013.01); *H01F 7/0221* (2013.01); *H01F 7/1623* (2013.01); *H01F 7/1638* (2013.01)

(58) Field of Classification Search
CPC ............... G02B 26/085; G02B 27/006; G02B 26/0841; G06F 7/70825; G06F 7/7095; G06F 7/70291; G06F 7/70916; H01F 7/1638; H01F 7/0221; H01F 7/1623
USPC ................................ 355/30, 53, 77; 335/296
See application file for complete search history.

(56) References Cited

U.S. PATENT DOCUMENTS 5,337,033 A * 8/1994 Kinouchi et al. ............. 335/302
6,540,839 B1    4/2003 Lee et al.
(Continued)

FOREIGN PATENT DOCUMENTS

CN    1 299 300    2/2007
EP    1 467 385    10/2004
(Continued)

OTHER PUBLICATIONS

The Chinese Office Action, with translation, for corresponding CN Appl No. 201080015703.1, dated Jul. 12, 2013.
(Continued)

*Primary Examiner* — Steven H Whitesell Gordon
(74) *Attorney, Agent, or Firm* — Fish & Richardson P.C.

(57) ABSTRACT

The present disclosure relates to an actuator for projection exposure systems that include a magnet. The magnet is encapsulated and/or supported in a magnet holding plate that is produced by microtechnical production methods so that a moving manipulator surface is held in the magnet holding plate via monolithic or bonded connections without additional connecting material so that there is a secure connection.

33 Claims, 2 Drawing Sheets

(51) Int. Cl.
*H01F 7/02* (2006.01)
*H01F 7/16* (2006.01)

(56) References Cited

U.S. PATENT DOCUMENTS

| | | | |
|---|---|---|---|
| 7,233,383 B2 * | 6/2007 | Tokita et al. | 355/30 |
| 2003/0202234 A1 * | 10/2003 | Taylor et al. | 359/291 |
| 2005/0028890 A1 | 2/2005 | Sakaki et al. | |
| 2005/0190031 A1 * | 9/2005 | Miyata | 335/302 |
| 2006/0202564 A1 * | 9/2006 | Sakamoto et al. | 310/12 |
| 2006/0262435 A1 | 11/2006 | Denham | |
| 2008/0050581 A1 * | 2/2008 | Miwa et al. | 428/332 |
| 2008/0218298 A1 | 9/2008 | Miyata | |
| 2011/0267596 A1 * | 11/2011 | Muehlberger et al. | 355/67 |
| 2012/0327385 A1 | 12/2012 | Melzer et al. | |

FOREIGN PATENT DOCUMENTS

| | | |
|---|---|---|
| EP | 1 569 251 A2 | 8/2005 |
| EP | 1796141 | 6/2007 |
| JP | 2002-260916 | 9/2002 |
| JP | 2003-166080 | 6/2003 |
| JP | 2004-281654 | 10/2004 |
| JP | 2005-243882 | 9/2005 |
| JP | 2006-049758 | 2/2006 |
| JP | 2007-017562 | 1/2007 |
| JP | 2007-300791 | 11/2007 |
| JP | 2009-020219 | 1/2009 |
| WO | WO 2008/019860 | 2/2008 |
| WO | WO 2009/104962 | 8/2009 |
| WO | WO 2010049076 A2 * | 5/2010 |

OTHER PUBLICATIONS

English translation and Japanese Office Action for JP Application No. 2011-548661, dated Dec. 10, 2011.

International Search Report for corresponding PCT Appl No. PCT/EP2010/051238, dated May 20, 2010.

\* cited by examiner

ACTUATOR INCLUDING MAGNET FOR A PROJECTION EXPOSURE SYSTEM AND PROJECTION EXPOSURE SYSTEM INCLUDING A MAGNET

CROSS-REFERENCE TO RELATED APPLICATIONS

This application is a continuation of, and claims benefit under 35 USC 120 to, international application PCT/EP2010/051238, filed Feb. 2, 2010, which claims benefit under 35 USC 119 of German Application No. 10 2009 008 209.3, filed Feb. 10, 2009. International application PCT/EP2010/051238 is hereby incorporated by reference in its entirety.

FIELD

The present disclosure relates to a projection exposure system for microlithography, in particular a projection exposure apparatus which is operated with light of wavelength in the extreme ultraviolet range (EUV), having at least one magnet and an actuator for the actuation of optical elements in such a projection exposure system and a method for operating a corresponding projection exposure system. Moreover, a method for manufacturing a corresponding actuator for a projection exposure system is disclosed.

BACKGROUND

In projection exposure systems for microlithography, which are used to manufacture microtechnical, particularly microelectronic and/or micromechanical components, various components, especially optical elements, are moved, adjusted and positioned to some extent. For example, micromirror arrays (MMAs) can be used, in which a plurality of small mirrors are tilted.

The actuation of various components, such as the optical elements, especially micromirrors, can be effected with actuators based on an electromagnetic operating principle. To this end, an electromagnet, which is realized by an electric coil, generates a magnetic field that interacts with the magnetic field of a permanent magnet, so that corresponding forces for actuating the components are made available.

However, the manufacture of corresponding actuators, which often have very small dimensions in particular, is complex as a plurality of individual production steps are carried out. Furthermore, it should be ensured that the functionality of the actuator is not impaired. For example, in the case of microtechnically made actuators which have a plurality of connecting points called bond points, the problems which arise are not only of a kind which render the production effort involved immense but also the bond points often cannot reliably absorb the corresponding mechanical forces, in particular shear forces.

Moreover, such bond points may be harmed when certain wavelengths of light are used in the projection exposure systems, for example, in the extreme ultraviolet wavelength range.

In addition, the actuators or magnets in general may not otherwise be damaged by the prevailing operating conditions in the corresponding projection exposure systems, such as through stray light in the wavelength range of 13.5 nm and/or hydrogen atmosphere.

SUMMARY

The present disclosure provides a projection exposure system or actuators for a projection exposure system, as well as corresponding manufacturing processes or operating processes, which avoid disadvantages of certain prior art and, in particular, ensure safe and reliable operation of actuators for moving various components that have a long service life. Especially, the method for producing a corresponding actuator shall be effectively feasible and make a suitable corresponding actuator for accommodating stresses occurring during operation, such as shear forces. In addition, the actuator shall be suitable for use in a projection exposure system, in particular a projection exposure system which is operated in the wavelength range of extreme ultraviolet light.

The present disclosure is based on the insight that the use of electromagnetically-driven actuators that have at least one permanent magnet is impaired by the fact that permanent magnets based on rare earths, such as magnets based on samarium cobalt or neodymium-iron-boron, have a tendency to undergo hydride formation in the hydrogen atmosphere which can be present in a corresponding projection exposure system, with the result that the magnetic effect of the permanent magnet can be impaired or lost.

Accordingly, it is proposed from a first aspect of the present disclosure to completely encapsulate the magnet(s) of the actuator(s), such that the magnets are not exposed to the hydrogen atmosphere, which is partly composed of atomic hydrogen as well. In particular, all magnets can be completely encapsulated which are provided in an actuator or in all actuators of the projection exposure system or in parts thereof.

The encapsulation of the magnets can be a capsule housing and/or a coating on the magnet.

A corresponding coating can be chosen so that the coating not only yields a dense shell which separates the magnet from the surrounding atmosphere, but that is correspondingly resistant to hydrogen diffusion, such that no hydrogen can penetrate into the magnets over long periods. In particular, the coating can be formed in multiple layers.

The coating can be made of nickel, zinc, copper or alloys thereof.

Additionally or alternatively, a capsule housing can be provided in which the magnet is accommodated and which also effects gas-tight separation of the magnet from the surrounding atmosphere. The capsule housing can be formed from a metal, such as stainless steel, aluminium, aluminium alloys and the like.

In particular, the capsule housing can be welded from corresponding metal sheets, with the welding seams or abutting surfaces of the parts to be welded designed such that there is no straight or flat connecting region between the outside atmosphere and the inside of the housing. This makes sealing easier and also affords an easy way to protect the magnet, which is arranged inside the housing as the housing is being welded together, from welding damage.

The thickness of the housing or the metal sheet can be chosen in the range of 0.1 to 4 mm, with the minimum thickness of 0.1 mm ensuring that damage by hydrogen diffusion can be avoided or eliminated over the intended lifetimes, and the upper limit for the housing thickness or sheet thickness ensuring that sufficient magnetic forces can be used.

Apart from metallic housings, during formation of the actuator via microtechnical manufacturing processes, the capsule housing can also be formed from a corresponding micropatternable material, such as semiconductor materials, especially silicon, silicon alloys, germanium, germanium alloys and corresponding compounds thereof, such as silicon oxide and germanium oxide. The thickness of the wall of such capsule housings can be significantly lower, in the range from several nanometers or micrometers to several millimeters, for example up to 3 mm.

As magnets, all permanent magnets can be used, especially magnets based on rare earths, such as neodymium, praseodymium, lanthanum, cerium, compounds of these rare earths with iron and boron, in particular, neodymium-iron-boron, praseodymium-iron-boron, lanthanum-iron boron, cerium-iron-boron and samarium-cobalt.

Where samarium-cobalt magnets are used, encapsulation can be dispensed with too, provided that the operating parameters of the projection exposure system are kept within certain ranges. With samarium-cobalt magnets, it has been noted that irreversible hydride formation accompanied by damage to the magnet only commences when the hydrogen partial pressure exceeds a certain threshold, with the result that damage can be avoided by operating the projection exposure system below this threshold limit. As long as corresponding samarium-cobalt magnets are present in the projection exposure system, the hydrogen partial pressure should therefore be kept at less than or equal to 4.5 bar, preferably less than or equal to 3 bar, especially ≤1 bar.

At the same time, the temperature can be maintained at a temperature ≥15° C., especially ≥20° C.

From another aspect of the present disclosure, for which protection is sought independently and in conjunction with other aspects of the disclosure, an actuator is proposed, which is especially produced by microtechnical manufacturing processes, such that particularly convenient mounting of a mobile manipulator surface is obtained.

In corresponding actuators for projection exposure systems, the actuator has at least one manipulator surface on which the components to be actuated, such as optical elements, and in particular mirrors, can be arranged in order that, through movement or adjustment of the manipulator surface, movement or adjustment or general actuation of the components to be actuated may be realized. A corresponding actuator, which is based on the principle of the electromagnetic effect, has at least one magnet and an electric coil, which are arranged such that, when current flows through the coil, the resulting magnetic field interacts with the magnetic field of the permanent magnet to generate actuating forces that move the manipulator surface.

A corresponding actuator has a magnet mounting plate for mounting the magnet and a coil plate for holding or mounting the electrical coil, which are connected to each other in a suitable manner.

According to the disclosure, the manipulator surface is held monolithically or bonded with material continuity in the magnetic mounting plate under exclusion of an additional connecting material, such as an adhesive or a bonding material, for the purpose of secure mounting and bearing of the forces that arise, particularly shear forces. By monolithic is meant that the corresponding manipulator surface is machined from a single block of material, such that different materials are not used and there is no intentional phase boundary present, such as a former surface and the like. Alternatively, a bonded connection can also be provided, with the exception of corresponding adhesive compounds or compounds involving the use of additional connecting substances or connecting materials, such as bond materials and the like. However, it is possible in this regard for different materials to be present which have been applied, for example, by coating methods such as vapour phase deposition and the like.

Advantageously, in such a configuration, a magnet, which can be mounted opposite the manipulator surface, can be provided with a housing or capsule housing, with the manufacture of the corresponding capsule housing being integrated in the microtechnical production process. In particular, the manipulator surface can be formed at least partially by the housing or capsule body for the magnet, such that, in particular, the capsule housing too is connected with the rest of the magnet holding plate, particularly the mounting areas of the magnet holding plate, either monolithically or via a bonded connection with no additional connecting material.

The monolithic connection or the connection bonded with material continuity can be formed by a spring bar, which also provides the mobility for the manipulator surface.

Overall, the structure of such a manipulator can result from the fact that a multilayer structure or a structure in several planes is provided, wherein, in a first, lower plane, a coil plate is provided, with the coil mounted on a wafer or plate of semiconductor material, such as silicon. The coil can accordingly be made microtechnically by lithographic processes, and the like. In a second plane above the coil plate can be provided a magnet holding plate which is bonded by material continuity to the coil plate and/or connected via a connecting material. The magnet holding plate can serve to arrange the permanent magnet relative to the electric coil and to provide the moving manipulator surface. In this regard especially, the manipulator surface can be provided on one side of the permanent magnet. The manipulator surface and the magnet, with or without capsule housing, can be movably mounted in the magnet holding plate, wherein mounting is effected, for example, via at least one spring bar bonded or connected monolithically to mounting areas of the magnet holding plate on one hand and to the manipulator surface and/or the magnet housing on the other.

On the manipulator surface, appropriate components, such as mirrors or micro-mirrors, can then be arranged directly or via spacers and the like.

The manipulator surface and/or the magnet housing, the spring bar and/or the mounting areas of the magnet holding plate can be machined from the solid material of the magnetic mounting plate, such as a silicon wafer, by material-patterning techniques in accordance with microsystems technology.

Correspondingly, in one variant, initially one patternable plate, such as a silicon wafer, can be provided on which at least one spring bar structure can be formed between a later mounting area and at least one area of a manipulator surface, for example via lithographic deposition methods. Thereafter, a corresponding mobility of the manipulator surface can be realized by exposing the spring bar structure, wherein the manipulator surface is then held monolithically or bonded with material continuity on the patternable plate under exclusion of additional connecting materials, such as adhesives and the like. On the opposite side of the manipulator can then be arranged a magnet so that a corresponding magnet holding plate is created for the actuator structure described above. This can then be suitably connected to a corresponding coil plate and components to be actuated, e.g. using adhesives or other connecting materials.

In an alternative approach, in which a capsule housing for gas-tight compartmentalization of the magnet is formed at the same time, after the patternable plate has been provided and after the forming of the spring bar structure, a cavity is formed in the region of the manipulator surface, into which a magnet or corresponding magnetic powder can be inserted. It is worth pointing out that, in the present description, the terms magnet and magnetic powder can be used synonymously, so that, whenever a magnet is mentioned, realization with a corresponding magnetic powder or a compacted magnetic powder is meant as well.

After filling of the cavity with a magnetic powder, which can be in the form of a suspension, the cavity is sealed gas-tight by a cover element so that a capsule housing can be formed. The capsule housing is manufactured during exposure of the spring bar structure by leaving a corresponding wall area around the magnetic powder or the magnets in the cavity. This affords a very simple and effective way of manufacturing a manipulator surface with an encapsulated magnet that is optimally attached to the mounting areas of the magnet holding plate.

BRIEF DESCRIPTION OF THE FIGURES

Further advantages, characteristics and features of the present disclosure will become apparent from the following detailed description of embodiments and the accompanying drawings, which are purely schematic in form.

DETAILED DESCRIPTION

Figure 1:
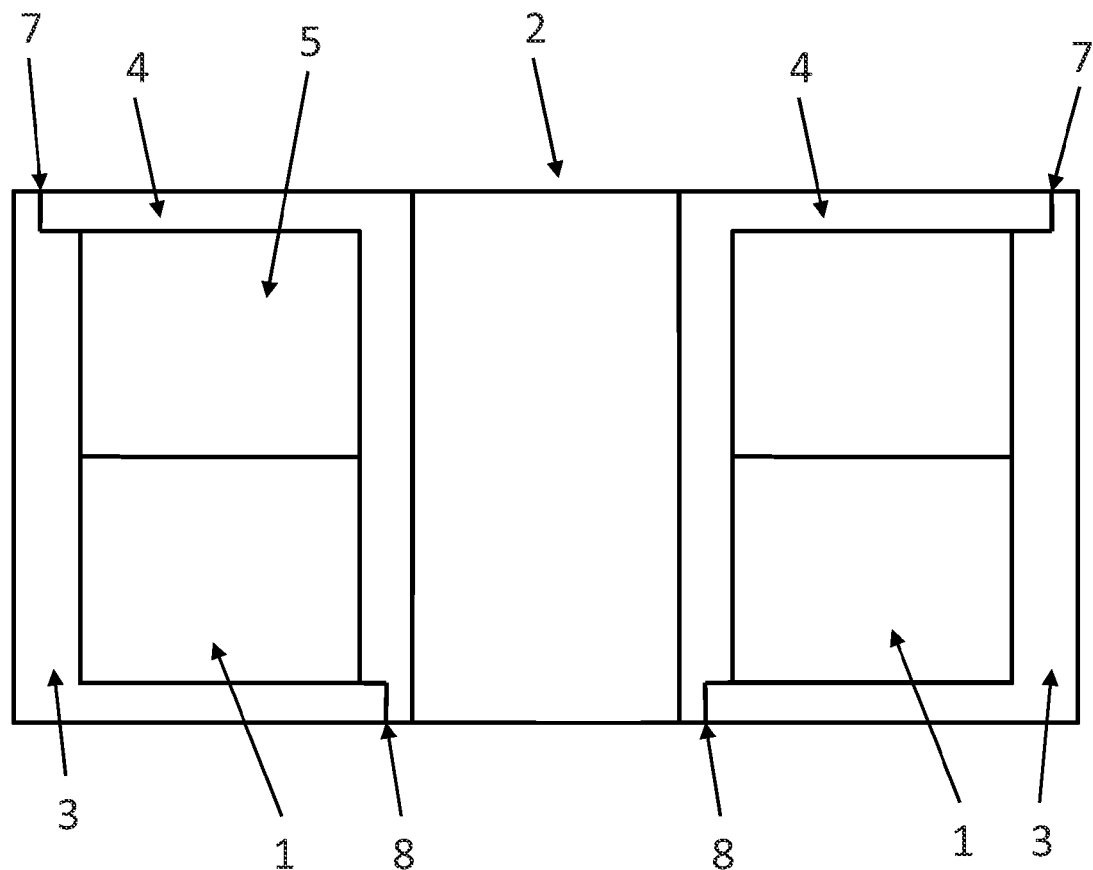
FIG. 1 shows a cross-sectional view through an encapsulated ring magnet according to the present disclosure.

FIG. 1 shows a cross-sectional view of a ring magnet 1, two parts of which are illustrated on account of the cross-section and the annular structure. The ring magnet 1 is intended for use in an actuator of a projection exposure system for microlithography, in particular a projection exposure system which operates in the wavelength range of extreme ultraviolet light. As the disclosure is suitable for all known projection exposure systems, for simplicity, a drawing of a projection exposure system has been dispensed with.

The magnet 1 can be, for example, a neodymium-iron-boron magnet or a samarium-cobalt magnet.

As the EUV projection exposure system is operated under a hydrogen atmosphere, damage to magnets, in particular those based on rare earths, can occur through hydride formation. To avoid contact with the hydrogen, the ring magnet 1 is protected from the ambient atmosphere by a corresponding annular capsule housing 2.

The annular capsule housing 2 is composed of two parts 3 and 4, which are welded together via circumferential weld joints 7 and 8. The parts 3 and 4 can be formed from a thin metal sheet with a thickness of 0.1 mm to about 4 mm, wherein the metal sheet is preferably stainless steel, aluminium or an aluminium alloy. It is advantageous for the capsule housing 2, by virtue of a corresponding austenitic microstructure portion in the stainless steel, to be at least partially nonmagnetic.

At the welded joints 7 and 8 are formed abutting surfaces of the housing parts 3 and 4 such that no direct straight or flat connecting surface is formed between the interior and exterior of the capsule housing 2. Rather, the abutting areas in the illustrated embodiment of FIG. 1 are angled. Not only does this improve the sealing function, it also has the advantage that during execution of the weld seam, the magnetic ring 1 arranged inside the capsule housing 2 cannot be damaged by the welding.

The capsule housing 2 is configured such that the interior of the capsule housing 2 is not completely filled by the ring magnet 1, but rather a residual volume 5 remains. The residual volume 5 can be filled with air or another gas, such that, by placing the encapsulated ring magnet 1 in a vacuum, the tightness of the capsule housing 2 can be verified.

Figure 2:
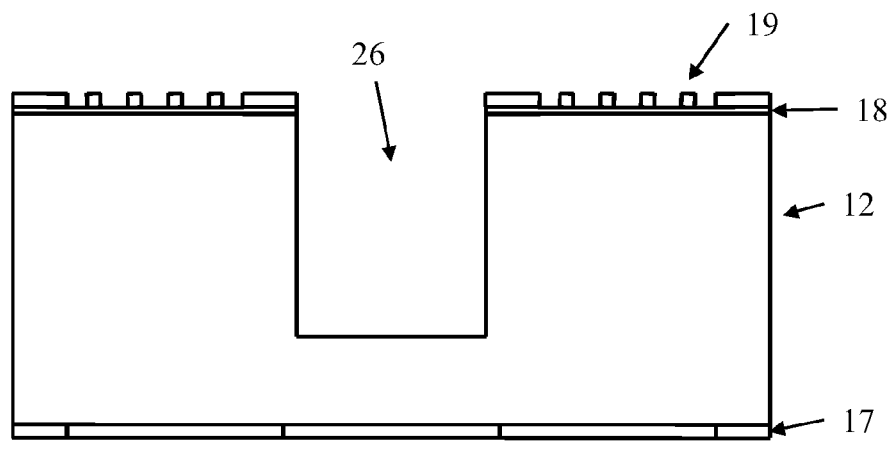
FIGS. 2 to 4 show cross-sectional views showing the manufacture of an inventive actuator.
Figure 3:
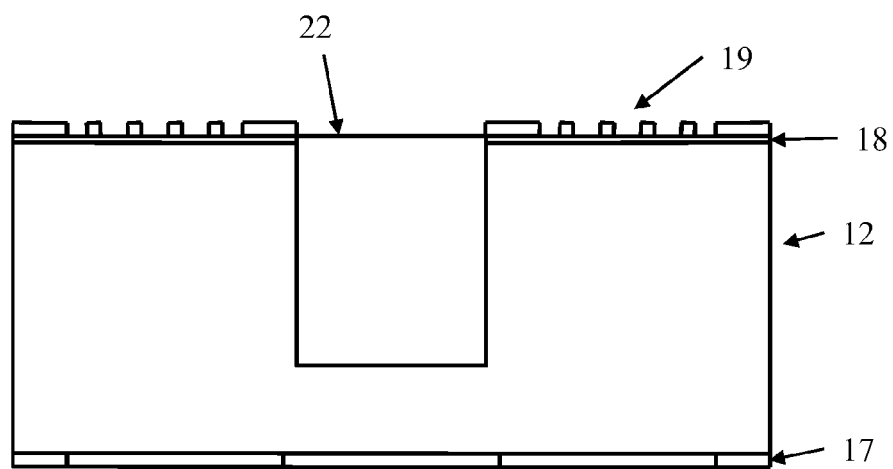
Figure 4:
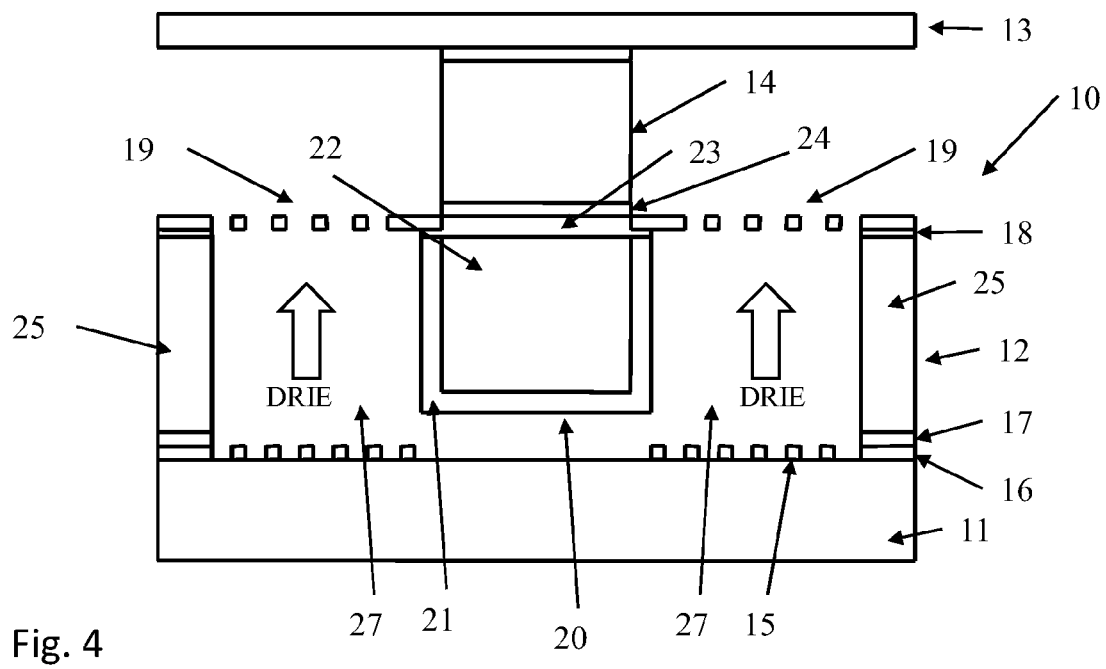

FIGS. 2 to 4 show a cross-sectional view of the manufacture of an actuator for use in a projection exposure system, in particular an EUV projection exposure system as per another embodiment. The actuator, whose manufacturing process is shown in FIGS. 2 to 4, is produced by a micro-patterning process, especially by lithographic methods, wherein the dimensions of the actuator are not limited to microtechnical orders of magnitude, but can certainly be realized in larger dimensions. For example, the size of the mirror 13, which is actuated by the actuator 10 (see FIG. 4), is in the order of magnitude of up to 4 mm in terms of diameter or edge length.

As is clear from FIG. 4, the actuator 10 can be divided into four planes, wherein the first plane is formed by a coil plate 11. The coil plate 11 in the illustrated embodiment is formed from a silicon semiconductor material and is used for mounting a microelectronic coil 15. The microelectronic coil 15 can be deposited on the surface of the coil plate 11 by lithographic deposition methods.

On the coil plate 11 is arranged a so-called magnet holding plate 12, which comprises a magnet 22 which cooperates with the coil 15 such that the mirror 13 can be moved and, especially, tilted. The design and manufacture of magnet holding plate 12 is described in detail below with reference to FIGS. 2 and 3.

On the magnet holding plate 12, which forms the second plane of the actuator 10, a spacer 14 is provided as a third plane opposite a magnet 22 on a manipulator surface 23, on which in turn is arranged the moving mirror 13 to be tilted.

As already mentioned above, flow of current through the coil 15 can generate a magnetic field that interacts with the magnetic field of the magnet 22 such that the mirror 13 tilts.

To facilitate the mobility of the manipulator surface 23 and the spacer 14 arranged thereon, the manipulator surface 23 and the magnet 22 are connected to the mounting areas 25 of the magnet holding plates 12 via a spring bar 19, such that deformation of the spring bar 19 enables tilting of the manipulator surface 23 and the spacer 14 arranged thereon and also the connected mirror 13.

The spring bar 19 in the embodiment shown is executed as a spiral spring around the area of the manipulator surface.

The microtechnical manufacture of the actuator 10 is partially shown in FIGS. 2 and 3. FIG. 2 is a cross-sectional view through the magnet holding plate 12 at an early stage of production. At this production stage, the magnet holding plate 12 already has the corresponding microstructure for the spring bar 19. This can also be produced, for example, by lithographic deposition methods, with corresponding deposition of the material by vapour phase deposition. The magnet holding plate 12 in the illustrated embodiment is made of silicon, such that the microstructure for the spring bar 19 can also be formed from silicon.

Prior to deposition of the patterning layer for the spring bar 19, a passivation oxide, for example, silicon dioxide, can be formed on the surface of the silicon wafer, from which the magnet holding plate 12 is formed, to serve as protective layer for subsequent patterning processes. Accordingly, a silicon dioxide protective layer 17 can also be provided in certain areas on the lower side, with recesses for subsequent material-removal areas already provided in the silicon dioxide areas. Equally, a recess is provided in the centre of the silicon dioxide layer 18, such that in the silicon wafer a cavity 26 can be formed, which serves to accommodate a magnet or magnetic powder 22. The magnetic powder can be filled in as pure powder or as suspension in liquid form and dried or cured in a subsequent step, and if necessary magnetized. FIG. 3 shows the magnet holding plate 12 from FIG. 2 with the filled-in magnetic powder or magnet 22.

Then, the magnet holding plate 12 is processed by a dry etching method from the rear side, at which the protective layer 17 is provided, via a dry etching method to remove material in the region of the spring bar structure 19. For this purpose, for example, deep reactive ion etching (DRIE) can be used to remove the silicon down to the $SiO_2$ protective layer 18 below the spring bar structure 19. This creates the free space 27. The silicon dioxide protection layer 18 serves in this regard as a stop layer for the dry etching process and can then be dissolved by a suitable method, such that the spring bar 19 is exposed.

During formation of the annular free space 27 by DRIE dry etching, a pot-shaped housing structure 21 is left around the magnet or the magnetic powder 22 such that an encapsulated magnet unit 20 is created. The capsule housing 21 of the encapsulated magnet unit 20 is bonded with material continuity to the spring bar 19 which, in turn, is bonded with material continuity to the mounting areas 25 of the magnet holding plate 12.

On the upper side, the magnet housing 21 can be sealed with a cover element 23, which is deposited in the form of a coating or similarly bonded with material continuity to the other housing parts. By way of alternative to the cover element 23, the spacer 14 can be used directly to seal the capsule housing 21 by a connecting layer 24, for example via a so-called bond site, which is afforded by eutectic metal bonding.

On the spacer 14 can be arranged the mirror 13, again through a corresponding connecting layer, while, at the lower side of the magnet holding plate 12, the coil plate 11 can be arranged via a connecting layer 16, for example via eutectic metal bonding.

Through the microtechnical manufacture, an encapsulated magnet 20 can be immediately bonded with material continuity and movably mounted in a magnet holding plate 12 without corresponding connecting layers to hold the magnet and a manipulator surface connected to it, such as adhesive layers and the like, which, particularly in projection exposure systems which are operated in the wavelength range of extreme ultraviolet light, can prove problematic in terms of service life. In addition, such connecting layers can be problematic with regard to accommodation of shear forces. This is avoided in the present manufacturing technique, as the spring bar and the housing 21 of the magnet 22 are bonded with material continuity to the mounting areas 25 without the interposition of any mechanism of connection. In particular, the oxidation layer 18 in the area of the mounting areas 25 can be dispensed with, as a result of which the silicon of the spring bar structure 19 deposited by vapour phase deposition on the silicon is deposited directly on the silicon of the silicon wafer where it possesses optimum adhesion.

Although the formation of the magnetic housing 21 with the encapsulated magnet 20 is advantageous, the formation of an actuator is also conceivable in which, instead of the magnetic housing 21 between the spring bar regions 19, a continuous plate for forming the manipulator surface 23 is provided and the magnet is attached to the underside of the manipulator surface 23 by a corresponding connection technique, such as adhesive bonding and the like. This case, too, affords the advantageous configuration of the actuator having a favourable monolithic connection or bonded connection with material continuity of the spring bar to the holding area(s) without interposition of any connecting layers, such as bond layers or adhesive layers. In particular, such a design can be chosen for samarium-cobalt magnets for which, given corresponding operating conditions of hydrogen pressures of less than 4.5 bar, in particular less than 3 bar, preferably <=1 bar, and operating temperatures >15° C., especially >20° C., encapsulation is not absolutely necessary.

It is also conceivable for magnets which are mounted to the rear side of the manipulator surface 23 to be protected against the influence of hydrogen by an appropriate coating, such as nickel and the like.

Although the present disclosure has been described in detail with reference to the attached embodiments, it is clear to a person skilled in the art that the disclosure is not limited to these embodiments, but rather that variations and modifications are possible without departing from the scope of the appended claims. In particular the modifications can relate to the omission of individual features or different types of combination of the features presented. In particular, the present disclosure comprises all combinations of all features presented.

What is claimed is:

1. A projection exposure system, comprising:
an actuator for a mirror of a micromirror array, the actuator comprising a completely encapsulated magnet;
a magnet holding plate; and
a manipulator having a surface at least partially held in the magnet holding plate via a connection selected from the group consisting of a monolithic connection and a connection bonded with material continuity without additional connection material,
wherein:
the magnet is encapsulated by a capsule housing that is a component selected from the group consisting of a monolithic component and a component bonded with material continuity of at least one of the magnet holding plate and the manipulator; and
the projection exposure system is a microlithography projection exposure system.

2. The projection exposure system in accordance with claim 1, wherein the actuator comprises a plurality of completely encapsulated magnets.

3. The projection exposure system in accordance with claim 1, wherein the capsule housing is resistant to hydrogen diffusion.

4. The projection exposure system in accordance with claim 1, wherein the capsule housing comprises at least one member selected from the group consisting of metal, stainless steel, aluminium and aluminium alloys.

5. The projection exposure system in accordance with claim 1, wherein the capsule housing comprises at least one member selected from the group consisting of semiconductor materials, silicon, silicon alloys, silicon oxide, germanium, germanium alloys and germanium oxide.

6. The projection exposure system in accordance with claim 1, wherein the capsule housing comprises a wall with a thickness between several nm and 3 mm.

7. The projection exposure system in accordance with claim 1, wherein the capsule housing has a thickness between 0.1 mm and 4 mm.

8. The projection exposure system in accordance with claim 1, wherein the capsule housing comprises a trapped gas volume.

9. The projection exposure system in accordance with claim 1, wherein the capsule housing is welded, and an abutting surface of the welded components, at which a weld seam is arranged and the components make contact, is arranged such that the abutting surface does not constitute a direct connection between the interior of the capsule housing and an outer environment.

10. The projection exposure system in accordance with claim 1, wherein the magnet comprises a rare earth material.

11. The projection exposure system in accordance with claim 1, wherein the capsule housing is formed via material removal.

12. The projection exposure system in accordance with claim 1, wherein the capsule housing formed via a patterning technique.

13. The projection exposure system in accordance with claim 1, wherein the capsule housing is mounted in the magnet holding plate so that the capsule housing is movable with the magnet holding plate.

14. The projection exposure system in accordance with claim 13, wherein the magnet holding plate is arranged on a coil plate having at least one electric coil so that a flow of current through the coil changes a position of the magnet and actuates the actuator.

15. The projection exposure system in accordance with claim 13, wherein the magnet with capsule housing is held in a recess of the magnet holding plate via a spring bar, the spring bar is connected monolithically or bonded with material continuity without connecting material to the capsule housing and the magnetic holding plate.

16. The projection exposure system in accordance with claim 1, wherein the projection exposure system is an EUV microlithography projection exposure system.

17. The projection exposure system of claim 1, further comprising:
   a coil plate; and
   a coil accommodated in the coil plate,
   wherein, when current flows through the coil, the magnet and the surface of the manipulator move.

18. The projection exposure system in accordance with claim 17, wherein the manipulator surface is opposite the magnet.

19. The projection exposure system in accordance with claim 17, wherein the manipulator surface is at least partially a housing for the magnet or a capsule housing for the magnet.

20. The projection exposure system in accordance with claim 17, comprising a spring between the surface of the manipulator an area of the magnet holding plate where the magnet is mounted.

21. The projection exposure system in accordance with claim 20, wherein at least one element is machined from via a material patterning technique, and the at least one element is selected from the group consisting the surface of the manipulator, the spring bar and the area of the magnet holding plate where the magnet is mounted.

22. The projection exposure system in accordance with claim 17, further comprising a spacer and a mirror, wherein the spacer is arranged at the surface of the manipulator, and the mirror is arranged at the surface of the manipulator.

23. The projection exposure system in accordance with claim 17, wherein the magnet holding plate and the coil plate are connected to each other via a bonded connection with material continuity and a connecting material.

24. The projection exposure system of claim 1, wherein the surface of the manipulator is at least partially held in the magnet holding plate via a monolithic connection.

25. The projection exposure system of claim 1, wherein the surface of the manipulator is at least partially held in the magnet holding plate via a connection bonded with material continuity without additional connection material.

26. The projection exposure system of claim 1, wherein the magnet is encapsulated by a capsule housing that is a monolithic component.

27. The projection exposure system of claim 1, wherein the magnet is encapsulated by a capsule housing that is a component bonded with material continuity of at least one of the magnet holding plate and the manipulator.

28. A projection exposure system, comprising:
   an actuator for a mirror of a micromirror array, the actuator comprising a completely encapsulated magnet;
   a magnet holding plate;
   a manipulator having a surface at least partially held in the magnet holding plate via a connection selected from the group consisting of a monolithic connection and a connection bonded with material continuity without additional connection material;
   a coil plate; and
   a coil accommodated in the coil plate,
   wherein:
      the magnet is encapsulated by a capsule housing that is a monolithic component;
      when current flows through the coil, the magnet and the surface of the manipulator move; and
      the projection exposure system is a microlithography projection exposure system.

29. The projection exposure system of claim 28, wherein the surface of the manipulator is at least partially held in the magnet holding plate via a monolithic connection.

30. The projection exposure system of claim 28, wherein the surface of the manipulator is at least partially held in the magnet holding plate via a connection bonded with material continuity without additional connection material.

31. A projection exposure system, comprising:
   an actuator for a mirror of a micromirror array, the actuator comprising a completely encapsulated magnet;
   a magnet holding plate;
   a manipulator having a surface at least partially held in the magnet holding plate via a connection selected from the group consisting of a monolithic connection and a connection bonded with material continuity without additional connection material;
   a coil plate; and
   a coil accommodated in the coil plate,
   wherein:
      the magnet is encapsulated by a capsule housing that is a component bonded with material continuity of at least one of the magnet holding plate and the manipulator;
      when current flows through the coil, the magnet and the surface of the manipulator move; and
      the projection exposure system is a microlithography projection exposure system.

32. The projection exposure system of claim 31, wherein the surface of the manipulator is at least partially held in the magnet holding plate via a monolithic connection.

33. The projection exposure system of claim 31, wherein the surface of the manipulator is at least partially held in the magnet holding plate via a connection bonded with material continuity without additional connection material.

* * * * *